United States Patent [19]
Lauffenburger et al.

[11] Patent Number: 5,432,474
[45] Date of Patent: Jul. 11, 1995

[54] FIXED AND ADJUSTABLE BANDWIDTH TRANSLINEAR INPUT AMPLIFIER

[75] Inventors: James H. Lauffenburger; George S. Moore, both of Colorado Springs, Colo.

[73] Assignee: Honeywell Inc., Minneapolis, Minn.

[21] Appl. No.: 221,910

[22] Filed: Apr. 1, 1994

[51] Int. Cl.[6] .............................. H03F 3/45; H03F 3/08
[52] U.S. Cl. .................................. 330/252; 330/308; 330/110
[58] Field of Search ...................... 307/492, 493, 494; 330/85, 110, 252, 254, 308, 260; 250/214 A, 241 AG, 214 L

[56] References Cited

U.S. PATENT DOCUMENTS

| | | | |
|---|---|---|---|
| 3,931,583 | 1/1976 | Gilbert | 330/260 X |
| 4,396,891 | 8/1983 | Johansson et al. | 330/254 |
| 4,492,931 | 1/1985 | Deweck | 330/294 |
| 4,502,017 | 2/1985 | Van De Plassche et al. | 330/151 |
| 4,608,542 | 8/1986 | Siegel | 330/279 |
| 4,881,043 | 11/1984 | Jason | 330/252 |
| 4,902,982 | 2/1990 | Moore et al. | 330/85 |
| 5,254,957 | 10/1993 | Lauffenburger | 330/308 |
| 5,276,407 | 1/1994 | Mead et al. | 330/308 |

OTHER PUBLICATIONS

"Current-mode Circuits From A Transliner Viewpoint: A Tutorial" by B. Gilbert, pp. 11-19 and 55-64 of Ch. 2 of *Analogue IC Design: the current-mode approach*, C. Toumazou, F. J. Lidgey & D. G. Haigh, eds., published by Peter Peregrinus Ltd., London (1990).

"A New Wide-Band Amplifier Technique," by Barrie Gilbert, *IEEE Journal of Solid-State Circuits*, vol. SC-3, No. 4, pp. 194-206 (Dec. 1968).

*Primary Examiner*—Steven Mottola
*Attorney, Agent, or Firm*—Dennis F. Armijo; Kenneth J. Johnson

[57] ABSTRACT

An improved method and circuitry for processing high-impedance (current mode) input signals for use in translinear and other mode circuits in a manner that avoids the signal dependent bandwidth variations that occur in the prior art. A non-linear feedback structure using a transconductance gain element is employed to extend the bandwidth and/or suppress bandwidth variations encountered in the prior art. One application of this invention is the extension of Gilbert amplifier topologies, with their attendant normalization and integrated circuit implementation advantages, for operation with very low input signal levels to high bandwidth applications. A further extension in this invention allow this transconductance to be electrically adjusted to allow active bandwidth control or to compensate for signal sources with different input capacitances. The invention is particularly suitable for use as a preamplifier for pairs of sensed photodetector current signals.

23 Claims, 7 Drawing Sheets

FIXED AND ADJUSTABLE BANDWIDTH TRANSLINEAR INPUT AMPLIFIER

BACKGROUND OF THE INVENTION

1. Field of the Invention

The invention relates to a method and apparatus for providing an input preprocessor function to realize the input current to voltage nonlinearity for translinear circuits (such as Gilbert amplifiers and multipliers) and other non-translinear circuits with a fixed bandwidth independent of signal level or temperature. Additionally, there is disclosed methods and apparatus for electrically adjusting the transconductance of an amplifier to allow the bandwidth of the invention to be electrically adjusted.

2. Background Art

A Gilbert amplifier is a special circuit technique that provides desirable attributes such as operation in a current gain mode with a wide bandwidth response for handling of current input signals such as photodetector signals.

FIG. 1 shows a prior art Gilbert amplifier model as disclosed in "Current-mode Circuits From A Translinear Viewpoint: A Tutorial" by B. Gilbert, pp. 11–19 and 55–64 of Ch. 2 of *Analogue IC Design: the current-mode approach*, C. Toumazou, F. J. Lidgey & D. G. Haigh, eds., published by Peter Peregrinus Ltd., London (1990). The photodetector pair is modeled as current sources 10 and 12 with a parallel capacitances 14 and 14'. The output current difference is proportional to the difference of the input photocurrents, with a gain factor proportional to the control current.

Ignoring second-order effects, the overall gain of this can be calculated as:

$$\frac{I_{out} \text{ (differential)}}{I_{ina} - I_{inb}} = \frac{I_{cntrl}}{I_{ina} + I_{inb}} \quad (1)$$

where:

$I_{out(differential)}$ is the difference in output currents;

$I_{ina}$ and $I_{inb}$ are input currents; and $I_{ctrl}$ is the tail current.

The features of the prior art Gilbert amplifier are wideband normalization, fast overload recovery, good accuracy for DC and wideband signals, simple implementation of automatic gain control, and stability for any input condition.

The problem with the prior art Gilbert amplifier is that the bandwidth is a function of a) DC input current level; b) temperature; and c) input capacitance.

$$\text{Bandwidth} \approx \frac{q^* I_{inavg}}{k^* T^* C_\epsilon} \quad (2)$$

where:

$$I_{inavg} = \frac{I_{ina} + I_{inb}}{2}$$

Thus, bandwidth and group delay (time delay through the circuit) is dependent on the source characteristics and temperature.

Optical disk drives have a number of input signals in the form of differential input currents, for example, photodiodes. These include focus error signals, magneto optic (MO) read channel signals and actuator position signals. A normalized amplifier is typically used for noise and servo compensation reasons. Prior normalized amplifier implementations, i.e., Gilbert amplifiers, do not provide adequate bandwidth at the lower input signal levels associated with MO (erasable) drives.

U.S. Pat. No. 4,396,891 to Johansson et al. describes a gain control circuit that is related to a Gilbert multiplier, but does not address high impedance input signals or bandwidth.

U. S. Pat. No. 4,492,931 to Deweck discloses an infrared receiver front end which includes a transimpedance amplifier as opposed to a translinear amplifier (Gilbert). Deweck discloses a preamplifier for interference rejection and does not deal with bandwidth.

U.S. Pat. No. 4,502,017 to Van de Plassche et al. discloses an operational amplifier, however, it is not usable with translinear circuits.

U.S. Pat. No. 4,608,542 to Siegel, like Deweck, describes a bandwidth control of transimpedance amplifiers, however, it is not usable with translinear amplifiers.

U.S. Pat. No. 4,902,982 to Moore et al. describes a nonlinear noninverting transimpedance amplifier that uses a nonlinear feedback structure to prevent overload of high dynamic range signals. This circuit is not translinear and the device does not deal with bandwidth controls.

U.S. Pat. No. 5,254,957 to Lauffenburger is the most analogous reference. The present invention overcomes shortcomings of Lauffenburger which are bandwidth variations with temperature and signal level.

In accordance with the present invention there is provided an apparatus for amplifying and processing high-impedance current mode input signals that provides input normalization, DC accuracy and wide band signal handling.

The preferred input preprocessor provides nonlinear transformation of a current mode input signal for a single input Gilbert amplifier. The processor reduces bandwidth dependency on the input current. The preprocessor is comprised of a common base transistor which acts as a feedback element for nonlinear conversion of the input current to a voltage. A transconductance element is applied to the transistor for setting a bandwidth for the input preprocessor.

The apparatus can also comprise multiple preprocessors with multiple current inputs. In this embodiment, the preferred translinear circuit is a differential Gilbert amplifier. The apparatus may further comprise at least one replicating transistor for replicating a current through the input preprocessor. The replicating current mirror comprises transistors with common emitters and common bases with the common base transistor.

The method is also disclosed for reducing bandwidth dependency on an input current for nonlinear current to voltage transformations. The steps comprise first providing a common base transistor as a feedback element for nonlinearly converting an input current to a voltage. A transconductance element is then applied to the feedback element for forward gain.

The method may also include the step of providing multiple preprocessors for multiple current inputs. In these steps, a multiple input differential Gilbert Amplifier is provided.

A primary object of the present invention is to provide all the advantages of a Gilbert amplifier for a low-current source.

A primary advantage of the present invention is that it provides a simple circuit implementation that achieves the desired goals of: a) operating with a low input bias current; b) wideband normalization of the input signal; c) fast overload recovery; d) good accuracy for DC and wideband signals; e) simple implementation of automatic gain control; and f) stability for a wide range of input conditions.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

DESCRIPTION OF THE PREFERRED EMBODIMENTS

Figure 1:
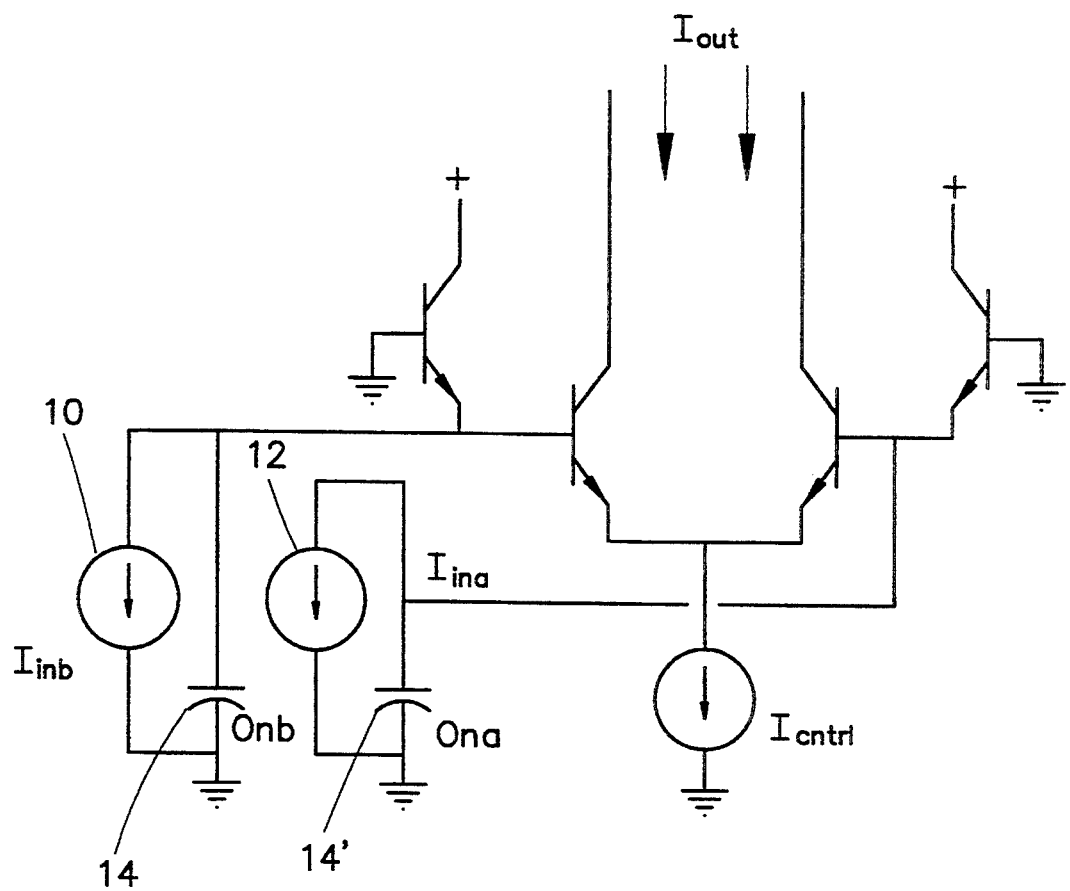
FIG. 1 is a model of a prior art Gilbert amplifier.

Preamplifiers for photodetectors generally have a number of conflicting constraints that must be satisfied. Some typically important requirements are: wide bandwidth, low noise, low offset, and good stability. Many other applications that have current source inputs also have similar constraints.

The typical preamp configuration in such an application is a transimpedance amp consisting of resistor feedback around a gain stage. This can have very good bandwidth and low noise, but there are a number of drawbacks, including: a) poor response to large input overloads; b) questionable stability for different source impedances; and c) gain control must be implemented separately.

Thus, the search for a different topology for photodetector preamplifiers was undertaken a number of years ago. The result was the selection of a translinear circuit "fragment" known as a Gilbert multiplier or amplifier as a useful base element. Gilbert amplifiers are a small subset of a general class of circuits referred to as translinear circuits. The term translinear is derived from the relationship between transconductance and current in a bipolar transistor; the transconductance of a bipolar transistor is linearly related to the current. While numerous linear circuits may be implemented using translinear techniques, numerous non-linear functions may also be realized. Functions such as squares, square roots, vector magnitudes, trigonometric functions, and the like, are easily realized with translinear topologies. The discussion below describes the application of the invention to differential Gilbert amplifiers, but the invention is equally applicable to the whole class of translinear circuits with both single or multiple inputs. In addition, the technique is applicable to an even broader class of circuits, both linear and nonlinear, that require other nonlinear current-to-voltage transformations of their input current signals. Some examples and generalizations will be presented at the conclusion of this development.

Gilbert amplifiers find common applications in many functions where it is desired to provide a normalized error signal of the form:

$$\frac{A-B}{A+B} I_g \quad (4)$$

where:

A and B are input currents; and $I_g$ is a gain factor.

In most cases, to obtain the desired function, it is required to use a Gilbert amplifier as the input processing function. If the magnitude of the current input levels is very low and parasitic input capacitance is present, obtaining the desired bandwidth may be difficult. Small signal analysis provides a rapid estimate of the bandwidth possible. The input to a Gilbert amplifier is basically a diode connected transistor or common base stage both of whose input resistance is approximately given by $V_t/I_e$ where $V_t$ is $kT/q$ (approximately 26 mV at room temperature) and $I_e$ is the signal current magnitude. For example, a 4 uA signal level (one side, A or B) would yield an input impedance of 6500 ohms at room temperature. The input capacitance, which includes the effective input capacitance of the diode or common base stage in parallel with the shunt capacitance of the signal source, reacts with this resistance to provide a single pole rolloff at $\frac{1}{2}\pi RC$. For a source capacitance of 3 pF and 4 uA signal level, the bandwidth is limited to less than 8 MHz without even considering the diode capacitance. Lower current levels and higher temperatures result in further bandwidth reduction. In addition, as the bandwidth is a strong function of the magnitude of the input signal level, under large signal conditions or, if a small signal is riding on a large bias level which may vary considerably over environment and process, significant bandwidth variation may occur.

The constant bandwidth Gilbert amplifier is founded on the replacement of the nonlinear input loads (diode connected transistors or common base stages) with feedback structures that yield similar transfer functions, but allow higher and more uniform bandwidth over a given input signal level range. As with all Gilbert structures, it is best suited to integrated circuit implementation to provide the required device parameter matching and temperature coupling. In addition, integrated circuit fabrication allows the minimization of parasitic capacitances which will be demonstrated to be the fundamental limitation of achievable improvement. The noise performance of this circuit can be quite good, but, as would be expected, does not necessarily approach that achievable with other low noise amplifier techniques such as transimpedance amplifiers.

Figure 2:
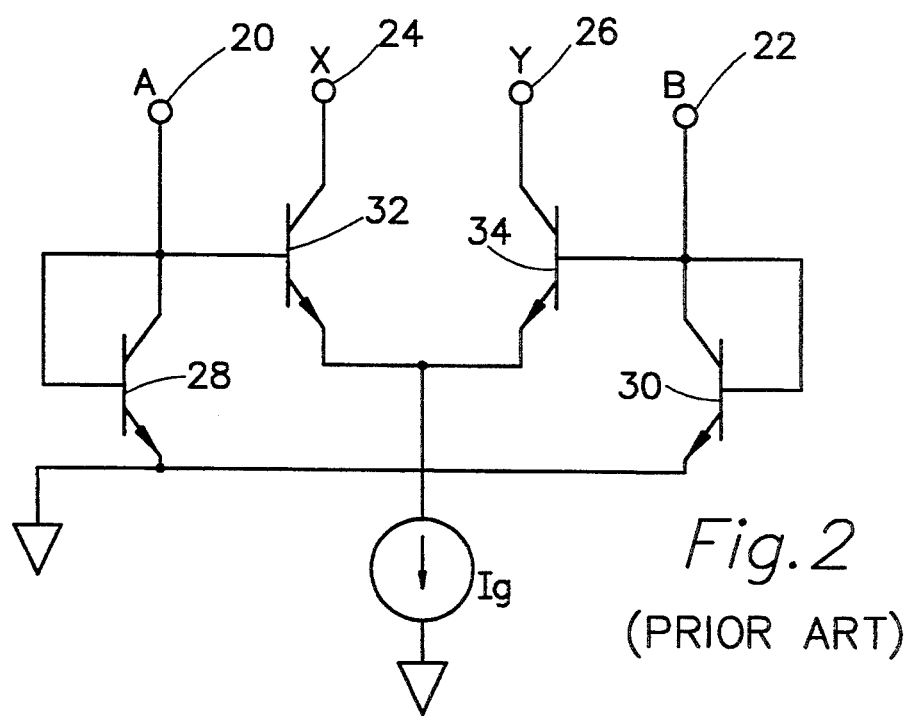
FIG. 2 is a schematic of a prior art type A Gilbert amplifier.
Figure 3:
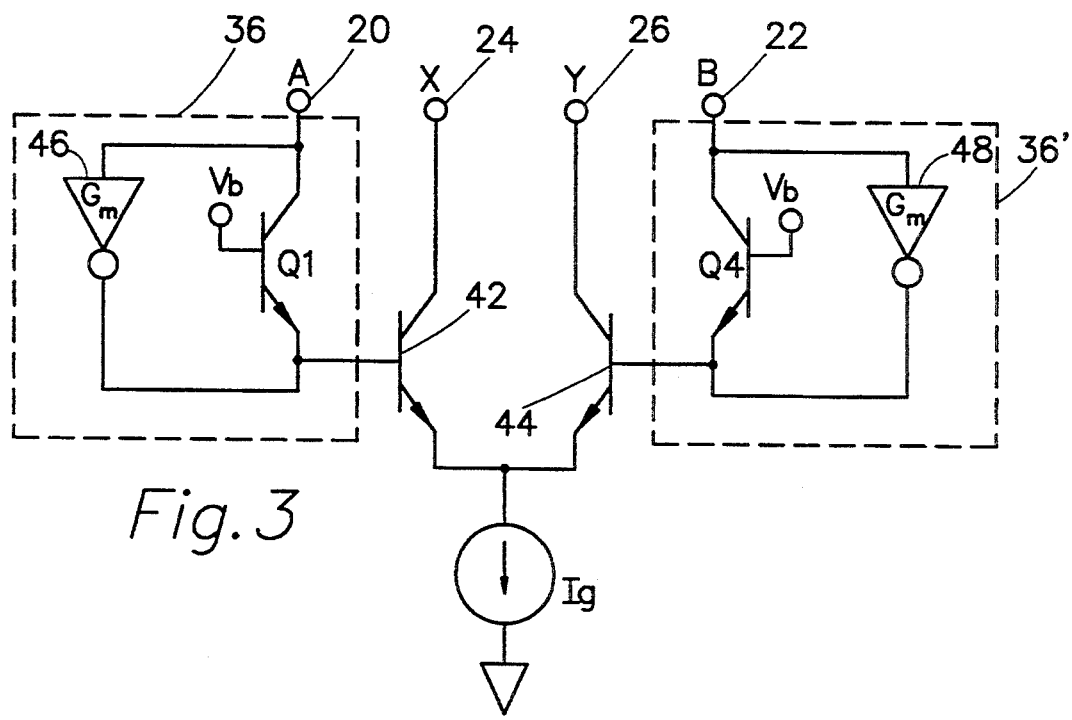
FIG. 3 is a schematic of the preferred constant bandwidth Gilbert amplifier.

FIG. 2 illustrates a basic Type A Gilbert amplifier operating on input currents A 20 and B 22 with output currents X 24 and Y 26. The nomenclature is from "Current-mode Circuits From A Translinear Viewpoint: A Tutorial" by B. Gilbert, pp. 11–19 and 55–64 of Ch. 2 of *Analogue IC Design: the current-mode approach*, C. Toumazou, F. J. Lidgey & D. G. Haigh, eds., published by Peter Peregrinus Ltd., London (1990). Transistors 28 and 30 are the diode connected transistors providing the nonlinear loads for the input signal currents to drive the differential pair formed by 32 and 34. FIG. 3 shows the essence of the present invention, replacing the nonlinear input load transistors 28 and 30 of FIG. 2, with feedback structures 36 and 36' employing a common base stage as the feedback element. $V_b$ is a fixed bias voltage selected to yield operation in the linear region. Of critical importance is forward amplifier 46 which provides a known transconductance, not voltage, gain. Feedback structures 36 and 36' result in signal current flowing in common base stage resulting in the non-linear voltage transfer function required to drive the differential pair 42 and 44. A well known technique in translinear circuit design is to place a transistor in the feedback of an operational amplifier for improved accuracy and other benefits. This is the same concept with the difference being the replacement of the operational amplifiers with broadband, fixed gain transconductance amplifiers 46 and 48. As defined in Gilbert, id., note that this structure is a Type B structure as compared to the original Type A function of FIG. 2, but that the desired transfer function is still obtained with the exception of an inconsequential inversion.

Figure 4:
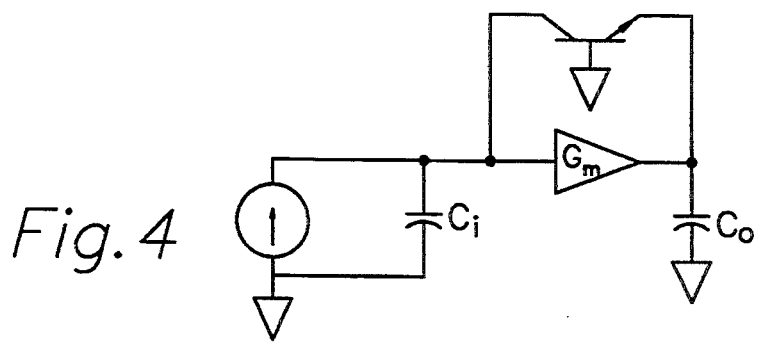
FIG. 4 is a model for the feedback structure for bandwidth parameter calculations.

FIG. 4 shows the feedback model analyzed herein to show the desired constant bandwidth attributes previously ascribed to this function. In feedback system terms, G(s) is equal to $-G_m$ and H(s) is given by $\alpha/sC_i$, where $\alpha$ is the common base current gain of the feedback transistor. F(s) is given by $1/sC_i$. The overall transfer function, feedback transistor current (emitter current) to current in, of this circuit is given by F(s)G(s)/(1G(s)H(s)) which is found to be:

$$\frac{1}{sC_i} \frac{-G_m}{1 + \frac{G_m \alpha}{sC_i}} = -\frac{1}{\alpha} \frac{1}{s \frac{C_i}{G_m \alpha} + 1} \quad (5)$$

Note that the emitter current is just $1/\alpha$ the input current. For high beta transistors, this value is approximately 1. More importantly, note that the time constant of the pole is given by $C_i/G_m\alpha$. Again for high beta transistors this value may be approximately as $C_i/G_m$. The bandwidth is seen to be determined by the input capacitance and the transconductance of the amplifier. With this simple model, the bandwidth may be chosen by simply selecting the transconductance of the amplifier. The bandwidth is not a function of the input signal level or the temperature of the circuit, assuming the amplifier transconductance is independent of temperature.

The above model is oversimplified, somewhat, in that it implies the bandwidth may be made arbitrarily large independent of signal level. The bandwidth of the transconductance amplifier is modeled as infinite, which is obviously not possible. However, in many cases sufficiently large transconductance bandwidth may be achieved such that it is not the dominant problem. A second approximation is that $\alpha$ does not vary with frequency. In reality, the common base stage will have a finite bandwidth also dependent on the operating current levels. Again, this is not necessarily the limiting effect.

The input to the common base stage may be modeled as diffusion, junction, and substrate capacitances in parallel with an input resistance of value $\alpha/G_m$, $G_m$ given by $qI_e/kT$. $I_e$ is the operating current level, therefore the resistance increases with decreasing operating current. Real implementations have other capacitances that add to this capacitance, including the output capacitance of the transconductance amplifier and interconnect capacitances. Even though the diffusion capacitance falls with falling operating current levels, the other capacitances are relatively constant. For sufficiently small current levels, these capacitances dominate and, with the increasing common base input resistance, yield another significant pole within the loop. As the current level decreases, the phase lag of this pole and of the transconductance amplifier will eventually result in very low or even negative phase margin within the loop. Use of integrated circuit fabrication techniques allows very small geometry transistors to be employed minimizing these capacitances, thus maximizing the performance achievable. While not formally analyzed, it is believed that the ratio of the signal input capacitance to the capacitance at this node determines the improvement achievable with this technique.

Figure 5:
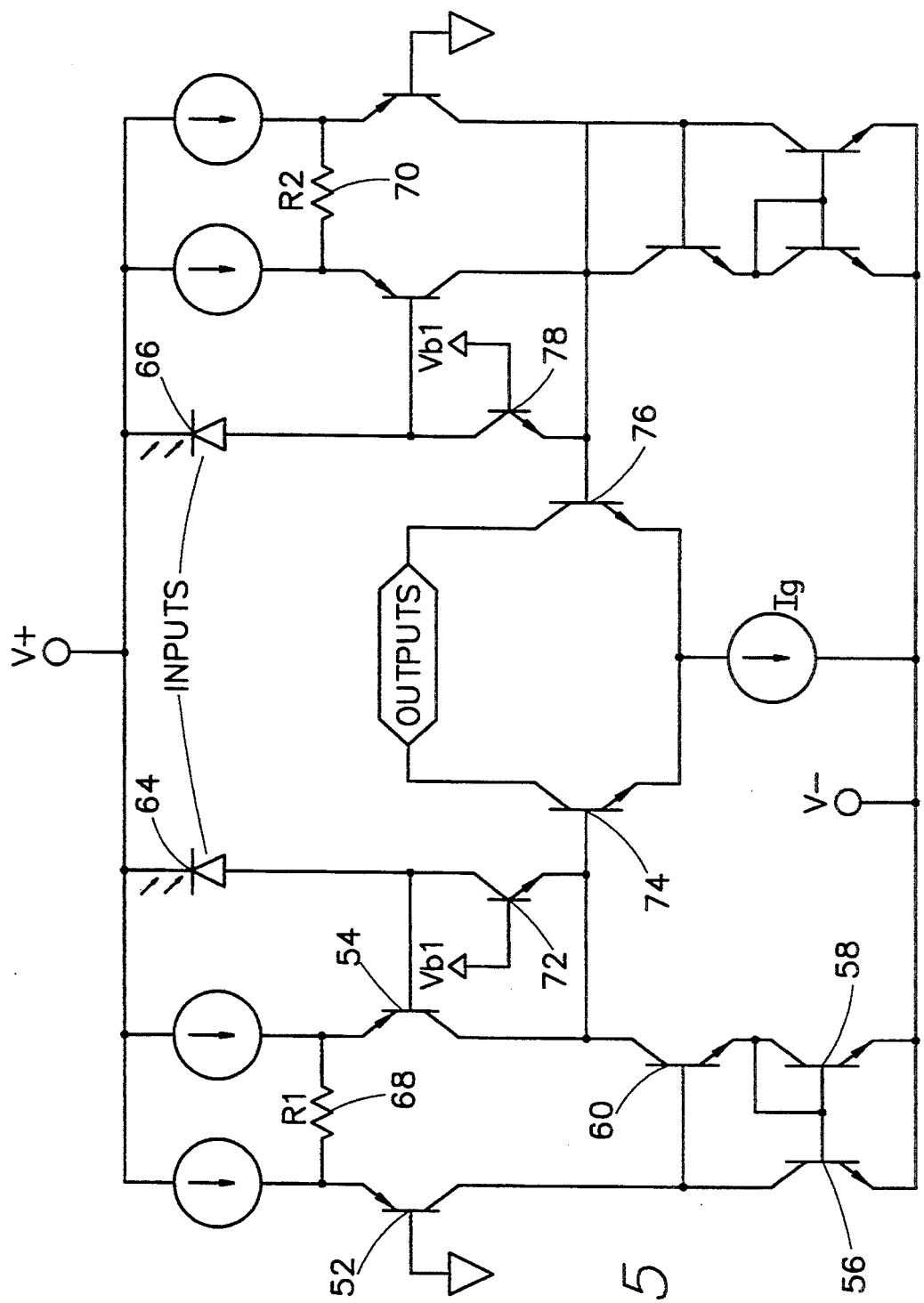
FIG. 5 is a schematic of the preferred constant bandwidth Gilbert amplifier in a practical implementation.

FIG. 5 illustrates one possible implementation of a constant bandwidth Gilbert amplifier employing the invention. The circuit is symmetrical and only the left side will be described. Input current sources 64 and 66 are photodiodes. Transistors 52, 54, 56, 58, and 60 form the left transconductance amplifier. The differential stage formed by 52 and 54 with emitter degeneration provide the basic transconductance function with the transconductance set by resistor 68. Resistors 68 and 70 can be internal or external. Transistors 56, 58 and 60 form a Wilson current mirror-to-mirror the current to the single-ended output at the collector of transistor 54. The transconductance is found to be approximately 2/R1 68. Transistor 72 is the common base feedback transistor that provides the nonlinear Gilbert load for the differential pair transistor 74. $I_g$ sets the Gilbert gain. $Vb_{b1}$ is a bias point at or slightly below ground in this implementation. The right side of this circuit operates similarly.

Figure 6:
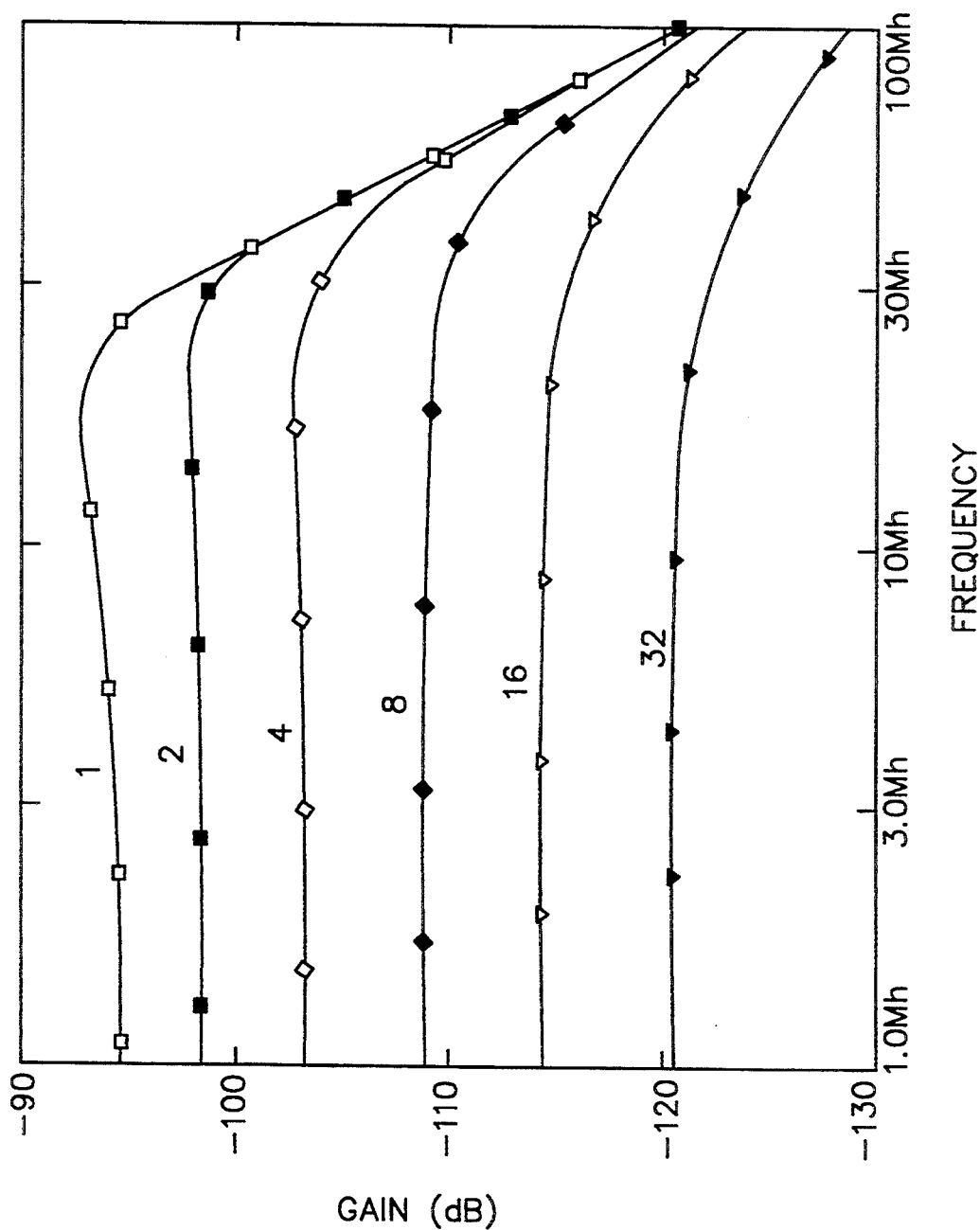
FIG. 6 is a graph of the small signal transfer function of the preferred integrated circuit of the invention.
Figure 7:
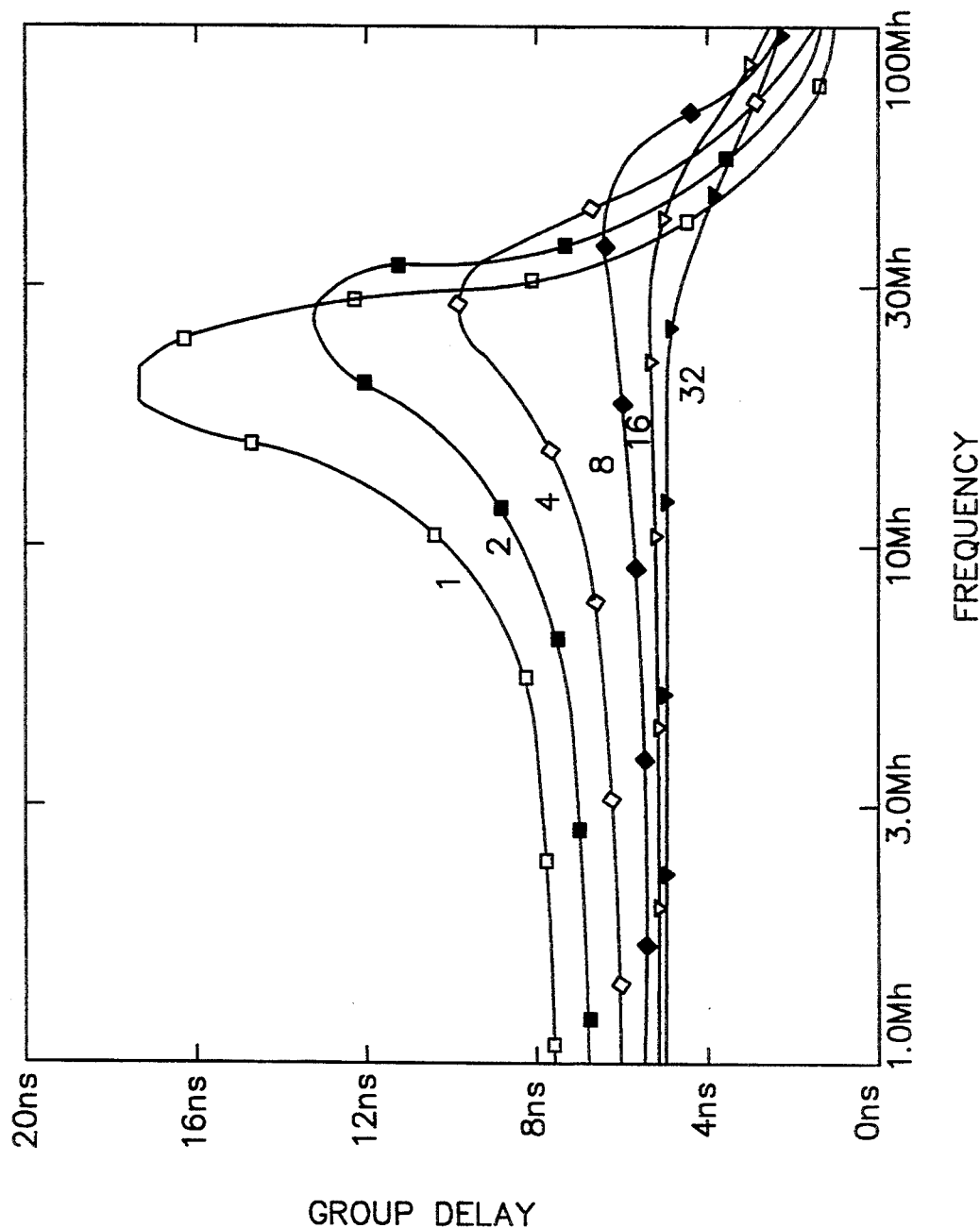
FIG. 7 is a graph of the group delay of the integrated circuit with conditions and values of FIG. 6.

FIG. 6 shows the small signal transfer function for an integrated circuit model of this function. The $F_t$ of the PNPs was approximately 1 GHz and the $F_t$ of the NPNs was approximately 6 GHz. The source capacitance was 3 pF and the single sided operating current level varied from 1 uA to 32 uA in octave steps as shown. The transconductance setting resistors were 2K yielding a transconductance of about 1 mS. This resulted in a bandwidth of about 30 MHz which remained reasonably constant except at the lowest current levels where bandwidth reduction and some peaking can be observed as the internal pole becomes active. FIG. 7 shows the group delay for the same conditions as described in FIG. 6. Again the group delay remains very consistent except at the very lowest operating current levels.

This implementation is by no means optimal or unique. The base current of 54 of FIG. 5 somewhat degrades the normalization as it becomes an additional additive constant term in the denominator of the normalized transfer function. This may be observed in FIG. 6. At the lowest current level the base current results in some loss of normalization as indicated by the reduced gain steps. Good normalization performance is observed for values of 4 uA and above. Referring again to FIG. 4, operating this transistor, 54 at the lowest current possible and using high beta transistors minimizes this effect. Use of base current cancellation techniques may be feasible, but the effects on noise performance must be considered. Other possible techniques to minimize this effect are to employ Field Effect Transistors (FETS) for transistor 52 and 54 or employ an FET source follower to isolate the base of transistor 54 from the input node. Noise effects of these variations must be carefully evaluated. Input offset errors in the transconductance amplifier are not critical so long as $V_b$ is chosen to insure the feedback transistor operates in the linear region. A single transistor transconductance amplifier may also be used. If transistor 52 eliminated, resistor 68 is tied to ground, and the mirror replaced by a current source matched to the emitter current source of transistor 54, this variation is realized. The current sources may also be approximated by resistors with appropriate voltage sources. This has the advantage that only two external pins would be required for the transconductance setting resistors instead of the four required for the above implementation.

In some cases it is necessary to have the input currents 64 and 66 available for reuse. Two or more transistors (not shown) in parallel with transistors 72 and 78 may be employed to effect this requirement. The bases and emitters are paralleled. The collectors of the additional transistors mirror the currents in 72 and 78 providing replicas of the input signals. Obviously this is not without cost as the capacitances at the critical internal nodes increase.

Different source conditions require different transconductance gain ($G_m$) values. Thus, a means of adjustability (external to the integrated circuit (IC)) of the gain in order to achieve the desired bandwidth for different source bias levels and capacitances is disclosed. The simplest means of adjustment is to control the $G_m$ by bringing out two pins per photodiode in order to connect a resistor across them. However, two pins per photodiode is a severe penalty in pin count if there are many photodiode preamplifiers on a single IC.

In an alternative embodiment, an adjustable gain stage is inserted into the transconductance gain path of the "fixed bandwidth" topology. This adjustable gain can be controlled (by a single pin external to the IC) to change the bandwidth of the preamplifier.

Figure 8:
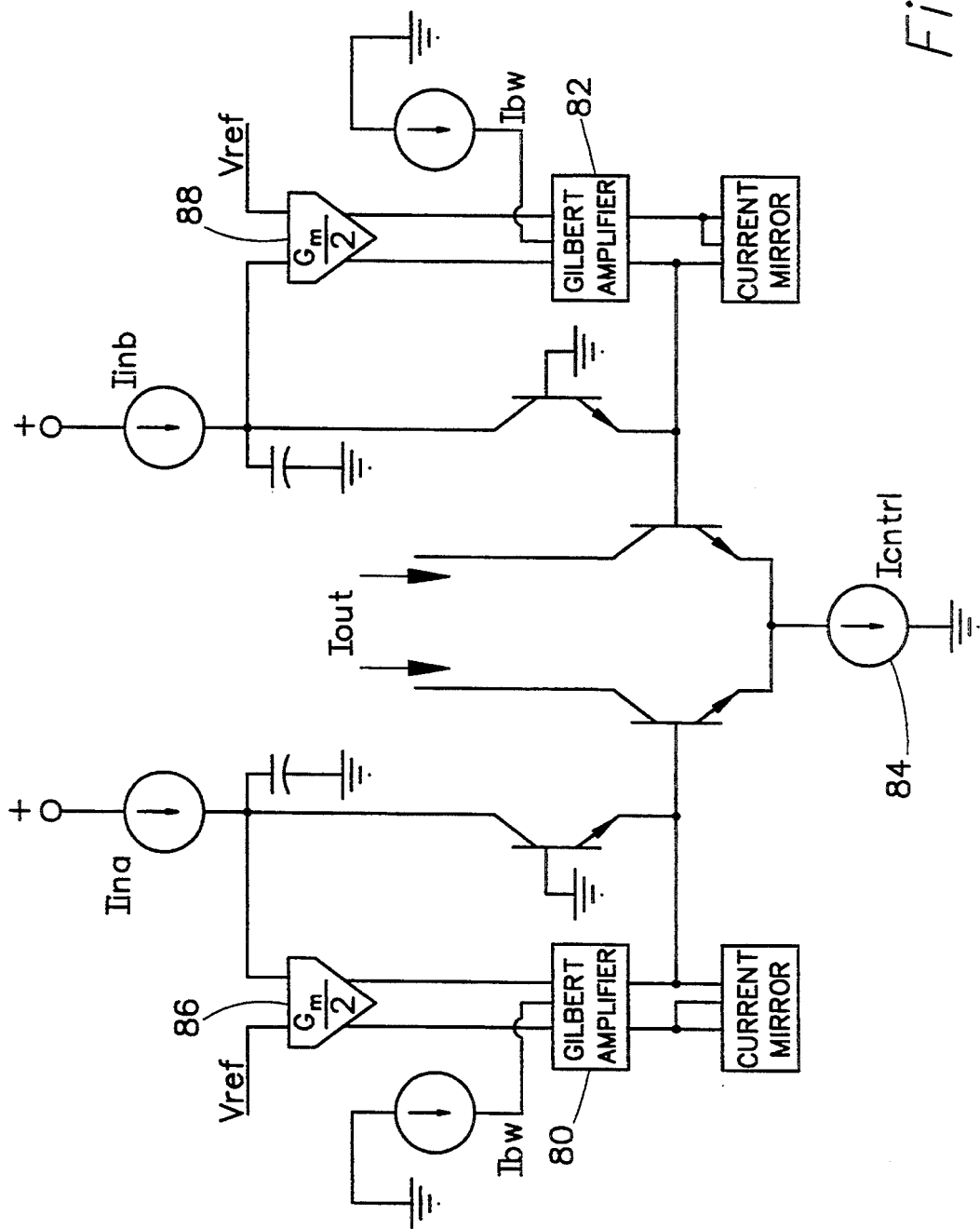
FIG. 8 is a schematic of the preferred adjustable bandwidth amplifier.

This embodiment is shown in FIG. 8. Differential current amplifiers 80 and 82 are inserted into each transconductance gain path 86 and 88. These current amplifiers 80 and 82 are preferably additional Gilbert amplifiers although other variable gain amplifiers can be utilized. The current gain of the inserted gain amplifier is directly proportional to the current labeled $I_{Bw}$. This allows direct control of the net transconductance gain, which sets the overall bandwidth of the preamplifier. Control current 84 can be applied to one external pin to allow adjustability after fabrication. This control current can be mirrored (replicated) to allow its application to multiple amplifiers simultaneously (not shown).

The bandwidth of this preamplifier is determined by the special feedback stage, and is approximately:

$$\text{bandwidth} = \frac{G_m * I_{BW}}{C_{in} * I_k} \quad (6)$$

where:

$G_m$ is the transconductance gain of the input error amp;

$I_{BW}$ is the tail current of the "new" gain stage;

$I_k$ is a constant; and $C_{in}$ is the total input capacitance including photodiode capacitance.

Thus, this embodiment is able to provide an externally controlled bandwidth control with only one pin. This is particularly important in applications where several photodiode preamplifiers are on a single IC and minimization of pin count is a priority. For example, an IC with 14 photodiode inputs without the adjustable gain stage above would require 28 extra pins to allow for bandwidth control. This embodiment results in one external pin for each different photodetector type and/or bandwidth.

An alternate method of electrically controlling the transconductance would employ a FET in-place of the transconductance setting degeneration resistor. The source of the FET is connected to the emitter (or source if a FET differential pair is employed) and, as the positive transconductance amplifier input is connected to (AC) ground, an adjustable voltage applied at the gate will realize a voltage controlled resistance.

A third method eliminates the degeneration resistor(s) and employs a variable emitter tail current to set the transductance. The transconductance is proportional to the current given the junctions temperatures are constant. By also making this variable current source proportional to absolute temperature (PTAT), this technique may be made applicable to applications with wide temperature variations. While this technique minimizes the base current in the transconductance element input (and its associated errors), the input signal level, for linear operation, is limited to the tail current. Also, the $F_t$s of the transistors in the transconductance amplifier may be significantly reduced for low values of tail current (transconductance).

The discussion of the preferred embodiment has emphasized the application of the method to the differential Gilbert amplifier. However, single input Gilbert topologies exist, as described in "A New Wide-Band Amplifier Technique," by Barrie Gilbert, *IEEE Journal of Solid-State Circuits*, Vol. SC-3, No. 4, pp. 194–206 (Dec. 1968), and the technique is equally applicable. As discussed below, many single and multiple input nonlinear translinear functions also exist, and this method of processing the input signal for increased bandwidth, reducing sensitivity to input signal current levels, and/or electrically controlling bandwidth is equally applicable to them.

For some of these functions, the input nonlinearity may be more complex than a simple diode junction current-voltage relationship. For example, some squaring circuits require the transformation to be the result of running the input signal current through the cascade of two diode junctions. This is easily effected in the feedback structure by inserting a diode connected transistor in between the emitter of the common base feedback element and the transconductance amplifier output.

While the discussions have focused on translinear circuits, numerous other functions that require a nonlinear transformation from current to voltage may also benefit from this technique. A simple example is the use of the method for replicating currents. A common technique in the design of current mirrors is to place radiometrically matched resistors in series with the emitter for various reasons. Note that the resulting increased input impedance will even further restrict bandwidth (but will reduce the sensitivity to current level) for the classical implementation. This current mirror variation is readily realized with the new method, but such mirrors are no longer strictly translinear because of the added resistors. Departing even further from translinear functions, analogous FET current mirrors may be realized,—with or without source resistors. Hence the method is applicable to a wide range of feedback non-linearities,—not just simple diode junctions.

In the discussion, photodiodes have often been employed as the input signal source. These are good examples of signal sources that approximate current sources in parallel with parasitic capacitance. In no way should it be implied that these are the only such sources and the method is equally applicable to all high impedance signal sources.

This invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

The entire disclosures of all references, applications, patents, and publications cited above, and of any corresponding application(s), are hereby incorporated by reference.

The embodiments of the invention in which an exclusive property or right is claimed are defined as follows:

1. An input preprocessor for providing nonlinear transformation for a single input Gilbert amplifier means of a current mode input signal, said input preprocesor reduce bandwidth dependency on said input current, said preprocessor comprising:
    nonlinear feedback means comprised of a common base transistor, for nonlinear conversion of an input current to a voltage; and
    transconductance means applied to said nonlinear feedback means for setting a bandwidth of said input preprocessor.

2. The invention of claim 1 further comprising multiple preprocessors with multiple current inputs.

3. The invention of claim 2 wherein said translinear circuit means comprises a multiple input differential Gilbert amplifier means.

4. The invention of claim 1 further comprising at least one replicating transistor for replicating a current through said input preprocessor.

5. The invention of claim 4 wherein said replicating current mirror means comprises transistors with common emitters and common bases with said common base transistor.

6. The invention of claim 1 wherein said nonlinear feedback means comprises a common gate transistor and at least one replicating transistor for replicating a current through said input preprocesor.

7. The invention of claim 6 wherein said at least one replicating transistor comprises common sources and common gates with said common gate transistor.

8. A differential amplifier circuit for a differential pair of current signals to develop an approximately constant bandwidth transfer function and a linear transfer output/input function, the circuit comprising a translinear circuit comprising:
    a pair of common base feedback means, each of said common base feedback means receives one of said pair of current signals and logarithmically converts the input current signals to a voltage
    a pair of transconductance means, each measuring a voltage at one of the differential input current signals and generating a proportional current at an output for driving one of said common base feedback means; and
    a differential pair of transistors driven by a difference of said logarithmic voltages at the outputs of said pair of transconductance means with linear differential output currents with respect to said differential input current.

9. An electrically adjustable variable bandwidth input preprocessor for a current input signal to reduce bandwidth dependency on said input current signal, said preprocessor comprising:
    nonlinear feedback means for a nonlinear conversion of an input current to a nonlinear voltage;
    transconductance means applied to said nonlinear feedback means for forward gain; and
    a variable gain amplifier for electrically varying said transconductance means and adjusting the bandwidth of said preprocessor.

10. The invention of claim 9 wherein said variable gain amplifier comprise Gilbert amplifiers.

11. The invention of claim 9 wherein said means for electrically varying comprises a unipolar transistor providing a voltage controlled resistance for degeneration.

12. A electrically variable bandwidth Gilbert amplifier circuit with reduced bandwidth dependency from an input source and an electrically controlled bandwidth, the circuit comprising:
    a pair of photodiodes as differential input current signals;
    a pair of nonlinear feedback circuits which provides a voltage which is a differential logarithmic function of the input current signals;
    a pair of transconductance amplifiers, each measuring a voltage at one of the input current signals and generating a proportional current at an output for driving one of said nonlinear feedback circuits;
    a circuit for electrically varying a transconductance of each of said transconductance amplifiers comprising a gain cell; and
    a differential pair of transistors driven by a difference of logarithmic voltage at the outputs of said pair of transconductance amplifiers with a linear differential output with respect to said differential input current signals.

13. A method of reducing bandwidth dependency on an input current for nonlinear current to voltage transformations, the method comprising providing a preprocessor comprising the steps of:
    a) providing a common base transistor as a feedback for nonlinearly converting an input current to a voltage, said common base transistor acts as an input preprocessor for a differential Gilbert amplifier; and b) applying a transconductance to the feedback element for forward gain.

14. The method of claim 13 further comprising the step of providing multiple preprocessors for multiple current inputs.

15. The method of claim 13 further comprising the step of replicating a current through the input preprocessor with at least one replicating transistor.

16. The method of claim 15 wherein the step of replicating comprises providing a current mirror utilizing transistors with common emitters and common bases with the common base transistor.

17. The method of claim 13 wherein the step of of providing a translinear circuit comprises providing a single input Gilbert amplifier.

18. The method of claim 13 wherein the step of providing a feedback element comprises providing a common gate transistor and replicating a current through the input preprocessor with at least one replicating transistor.

19. The method of claim 18 wherein the replicating step comprises providing common sources and common gates with the common gate transistor.

20. A method of electrically varying a bandwidth-adjustable translinear amplifier for a pair of input current signals, the method comprising the steps of:

a) providing voltage which is differential nonlinear function of the input current signals with a pair of nonlinear feedback elements;
b) providing a pair of transconductance means, each transconductance means performing the following steps:
   i) measuring a voltage at one of the input current signals; and
   ii) generating a proportional current for driving one of the nonlinear feedback element to reduce bandwidth dependency from the input current signals;
c) electrically varying the transconductance means; and
d) providing a differential pair of transistors driven by a difference of voltages of the pair of transconductance means with a linear output.

21. The method of claim 20 wherein the step of electrically varying comprises adjusting the transconductance means with variable gain amplifiers.

22. The method of claim 21 wherein the variable gain amplifiers comprise Gilbert amplifiers.

23. The method of claim 20 wherein the step of electrically varying comprises providing unipolar transistors as a voltage controlled resistance.

* * * * *